United States Patent [19]
Yang et al.

[11] Patent Number: 6,063,674
[45] Date of Patent: May 16, 2000

[54] METHOD FOR FORMING HIGH VOLTAGE DEVICE

[75] Inventors: Sheng-Hsing Yang; Kuan-Yu Fu, both of Hsinchu, Taiwan

[73] Assignee: United Microelectronics Corp., Hsinchu, Taiwan

[21] Appl. No.: 09/181,119

[22] Filed: Oct. 28, 1998

[51] Int. Cl.⁷ .................................................. H01L 21/336
[52] U.S. Cl. .......................... 438/286; 438/297; 438/529
[58] Field of Search ..................... 438/286, 297, 438/527, 529, FOR 190, 135

[56] References Cited

U.S. PATENT DOCUMENTS

| | | |
|---|---|---|
| 5,306,652 | 4/1994 | Kwon et al. . |
| 5,444,002 | 8/1995 | Yang . |
| 5,510,275 | 4/1996 | Malhi . |
| 5,521,105 | 5/1996 | Hsu et al. . |
| 5,548,147 | 8/1996 | Mei . |
| 5,578,514 | 11/1996 | Kwon et al. . |
| 5,739,061 | 4/1998 | Kitamura et al. . |
| 5,985,707 | 11/1999 | Gil . |

*Primary Examiner*—George Fourson
*Attorney, Agent, or Firm*—Thomas, Kayden, Horstemeyer & Risley

[57] ABSTRACT

A method for forming high voltage devices is provided. A P-type semiconductor substrate is provided. An oxide layer is formed on the P-type semiconductor substrate. A first P-well and a second P-well are formed in the P-type semiconductor substrate. A first N-well is formed in the second p-well and a second N-well is formed in the first P-well. A field oxide layer on the second N-well and a gate oxide layer are formed on the P-type substrate. A polysilicon layer is formed and defined as a gate on the gate oxide layer across a portion of the field oxide layer and aportion of the first N-well. A source region is formed in the first N-well and a drain region is formed in the second N-well. A P⁺-type doped region is formed between the substrate and the source region across a part of the first N-well within the second P-well.

6 Claims, 4 Drawing Sheets

METHOD FOR FORMING HIGH VOLTAGE DEVICE

BACKGROUND OF THE INVENTION

1. Field of the Invention

The invention relates in general to a fabricating method of forming a semiconductor device, and more particularly to a method which employs doping with different kind of dopant of different concentration to change electric field of a semiconductor device.

2. Description of the Related Art

As devices are designed and developed towards a smaller and smaller dimension, a channel length becomes shorter and shorter. The reduced channel length causes a faster operation speed of a device and other short channel effects. According to the formula "E=V/D", in which E is the electric field, V is the voltage, and D is the channel length, providing a constant voltage, the electric field is increased abruptly with reducing the channel length. The abrupt increase of electric field accelerates the electron in the channel. As a consequence, the electric breakdown occurs.

Most of conventional high voltage devices thicken an isolating layer between the gate and the source/drain regions as a means of lowering the horizontal electric field within the channel. Alternatively, the drift regions below the isolation layer and the graded regions beneath the source/drain regions are lightly doped to provide the necessary voltage gradient. The two above measures are capable of increasing junction breakdown voltage in the source/drain regions so that the high voltage devices are able to operate normally despite the application of a high voltage.

In general, the concentration of dopant in the substrate of a high voltage device is constant. The concentration of dopant in the drift region must be increased for enhancing current driving performance, but that may decrease the breakdown voltage of the high voltage device. The high voltage device has a lower breakdown voltage because there is a potential crowding effect forming near the margin of a drain region, so that the breakdown voltage is easily to occur.

In FIG. 1, a cross-section view of a conventional high voltage device structure is illustrated. A field oxide layer 102 and a gate 104 are formed on a P-type semiconductor substrate 100. An N+ doped region 106 used as a source region and an N+ doped region 108 used as a drain region are formed in the substrate 100. There is a P-type doped region 110 formed in the substrate 100 under the source region 106. An N− doped region 112 is set beside the drain region 108 and under the gate 104 and the field oxide layer 102. The formation of the field oxide layer 102 between the gate 104 and the drain region 108, the P-type doped region 110 and the N− doped region 112 can improve short channel effect.

Since the N− doped region 112 is set beside the drain region 108, there is still a junction between the drain region 108 and the substrate 100. The potential crowding effect may occur at the source/drain region-substrate junction so that the structure shown in FIG. 1 has a low efficiency of decreasing surface electric field. Furthermore, the structure can not significantly enhance current driving performance.

SUMMARY OF THE INVENTION

It is therefore an object of the invention to provide a fabrication method of high voltage devices. The concentration of dopant in a drift region of the device is increased to enhance the current driving performance. Since the drain region of the device adjoins a lightly doped region without directly adjoining the substrate, the electric field at the drain/source region-substrate junction formed in the prior art technique is decreased. The breakdown voltage is thus increased to reduce the potential crowing at the junction near the drain region and the substrate.

To achieve these objects and advantages, and in accordance with the purpose of the invention, as embodied and broadly described herein, the invention is directed towards a method for forming high voltage devices. A P-type semiconductor substrate is provided. An oxide layer is formed on the P-type semiconductor substrate. A first P-well and a second P-well are formed in the P-type semiconductor substrate. A first N-well is formed in the second P-well and a second N-well is formed in the first P-well. A field oxide layer on the second N-well and a gate oxide layer are formed on the P-type semiconductor substrate. A polysilicon layer is formed and defined as a gate on the gate oxide layer across a portion of the field oxide layer and a portion of the first N-well. A source region is formed in the first N-well and a drain region is formed in the second N-well. A P+-type doped region is formed between the source region and the P-substrate first N-well across a portion of the first N-well within the second P-well.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF EMBODIMENTS

FIRST EMBODIMENT

Figure 1:
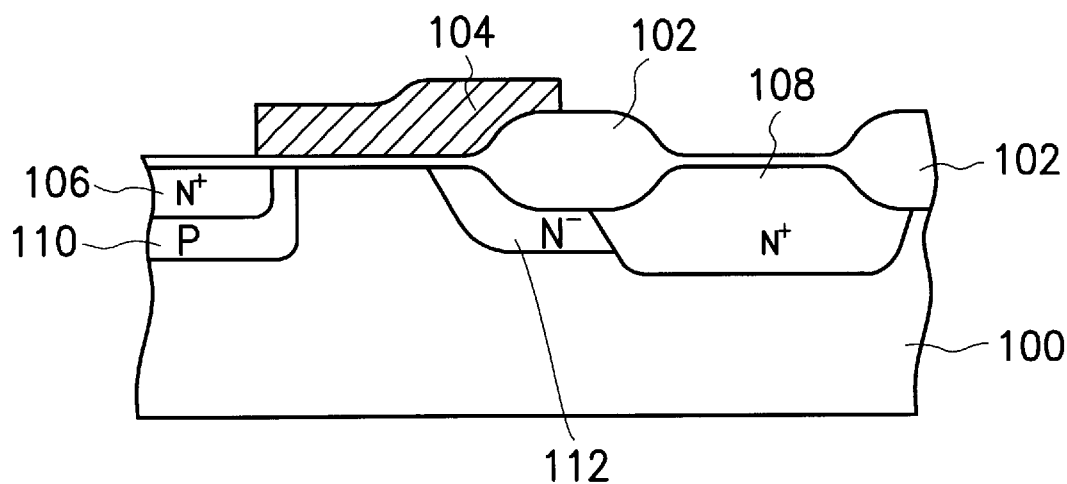
FIG. 1 is a cross-sectional view showing a conventional high voltage device.
Figure 2A:
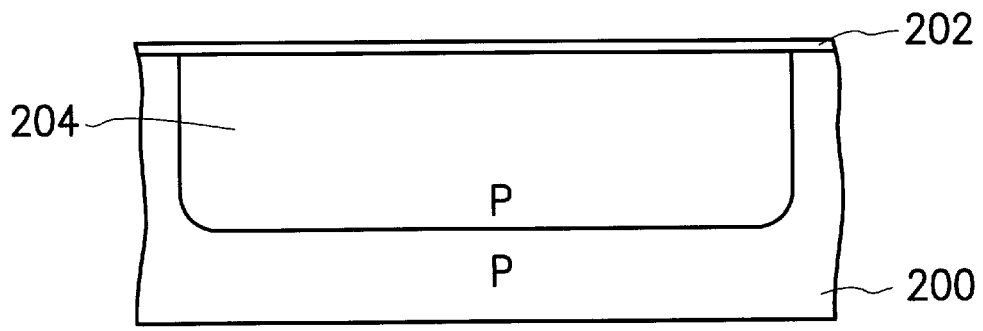
FIGS. 2A–2H are cross-sectional views showing the process steps of a first embodiment of the method for forming high voltage devices.

In FIG. 2A., an oxide layer 202 is formed on a semiconductor substrate 200. In the embodiment, a P-type semiconductor substrate is adapted. A first ion implantation and drive-in process is performed, so that a first P-well 204 is formed in the P-type semiconductor substrate 200. In this embodiment, the first P-well 204 is more heavily doped than the substrate 200.

Figure 2B:
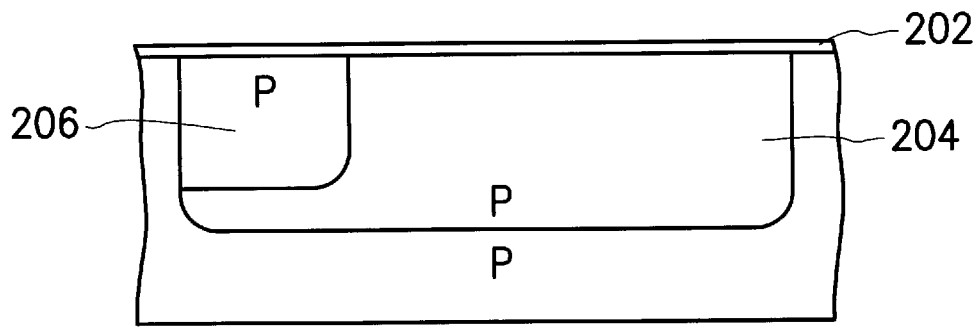

In FIG. 2B, a second implantation and drive-in process is performed, so that a second P-well 206 is formed in the first P-well 204. In this embodiment, the second P-well 206 is formed with a dopant concentration higher than a dopant concentration of the first P-well 204.

Figure 2C:
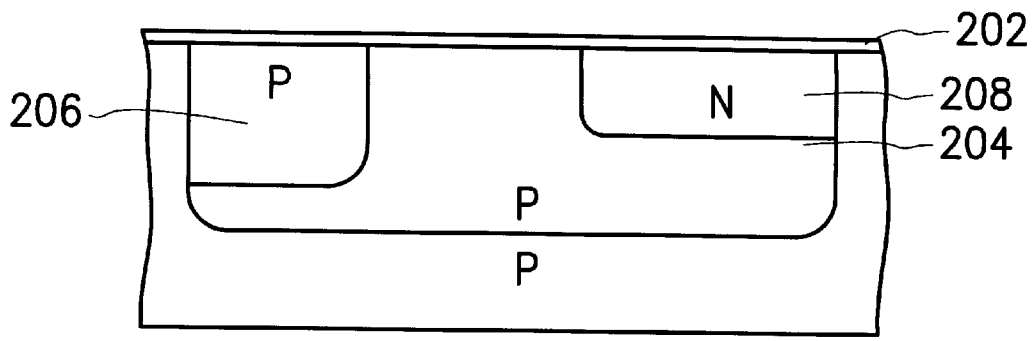

In FIG. 2C, a third implantation and drive-in process is performed, so that a first N-well 208a and a second N-well 208b are respectively formed in the second P-well 206 and in the first P-well 204.

Figure 2D:
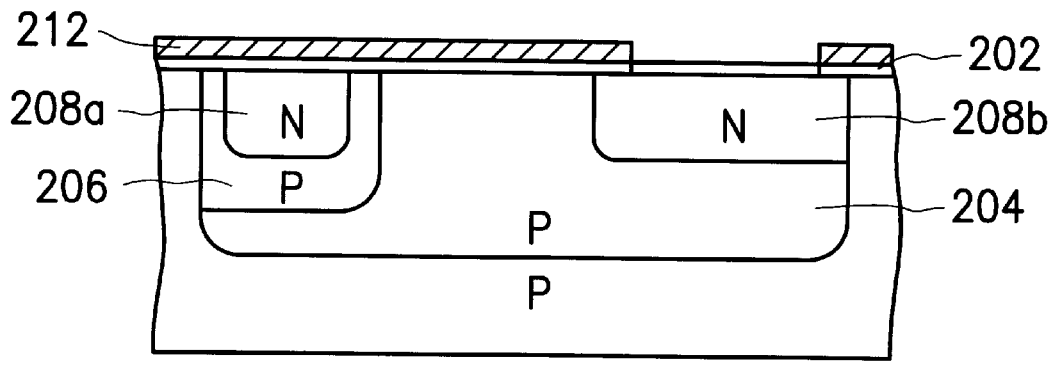

In FIG. 2D, the oxide layer 202 on the substrate 200 is removed. A pad oxide layer 210 and a silicon nitride layer 212 are formed and defined on the substrate 200 to partially expose the second N-well 208b in the first P-well 204 of the substrate 200.

Figure 2E:
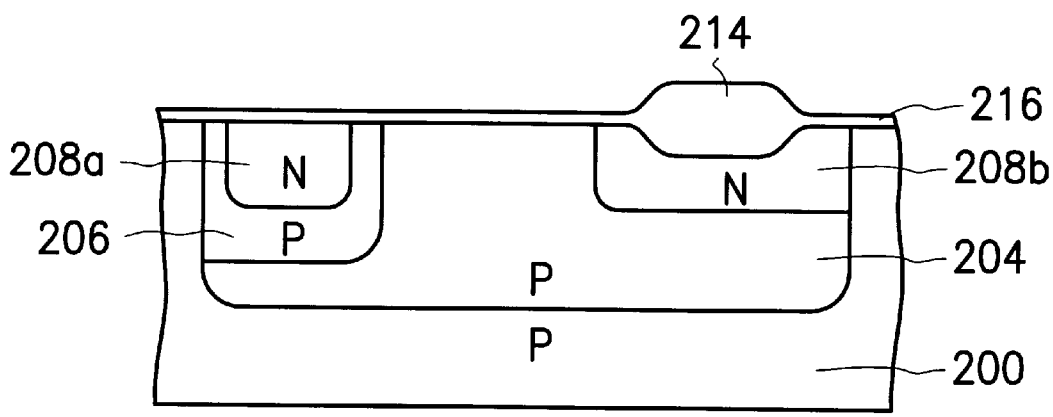

In FIG. 2E, a field oxide layer 214 is formed, for example, by thermal oxidizing the exposed substrate 200, that is, the exposed second N-well 208b. After the pad oxide layer 210 and the silicon nitride layer 212 are removed, a gate oxide layer 216 is formed on the substrate 200.

Figure 2F:
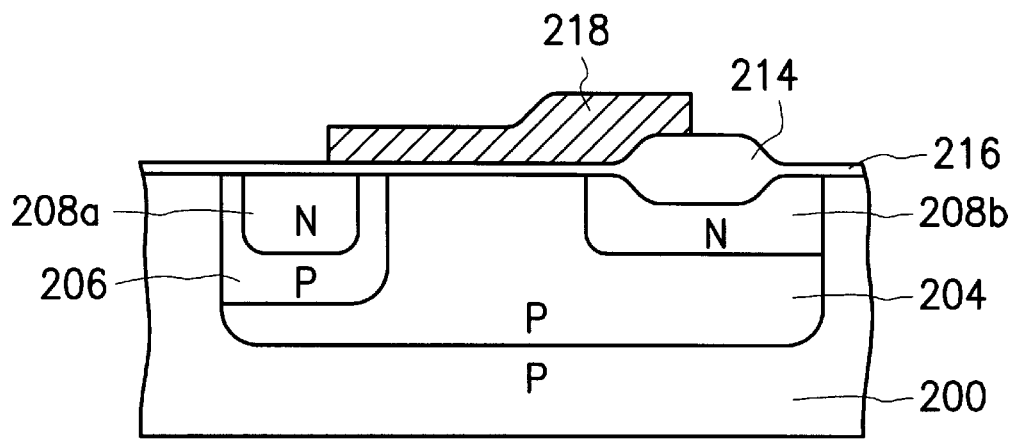

In FIG. 2F, a conductive layer 218, such as a polysilicon layer, is formed and defined as a gate of the structure shown in FIG. 2E. The conductive layer 218 as a gate is formed across a part of the first N-well 208a and a part of the second N-well 208b.

Figure 2G:
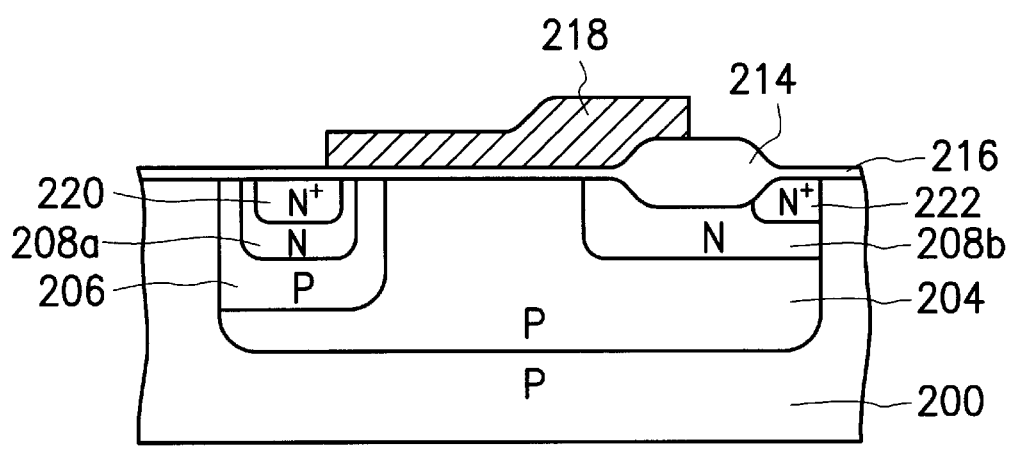

In FIG. 2G, the first N-well 208a comprises an N$^+$-type doped region 220 as a source region and the second N-well 208b comprises another N$^+$-type doped region 222 as a drain region. The N$^+$-type doped regions 220 and 222 are formed, for example, by implanting heavily N-type dopant into the first N-well 208a and the second N-well 208b through a mask (not shown). Each of the source region 220 and the drain region 220 has a dopant concentration higher than a concentration of the N-wells 208. In this embodiment, the "N$^+$" represents N-type dopant with a heavily dopant concentration and the "N$^-$" represents N-type dopant with a lightly dopant concentration. On the other hand, the "P$^+$" represents P-type dopant with a heavily dopant concentration and the "P$^-$" represents P-type dopant with a lightly dopant concentration.

Figure 2H:
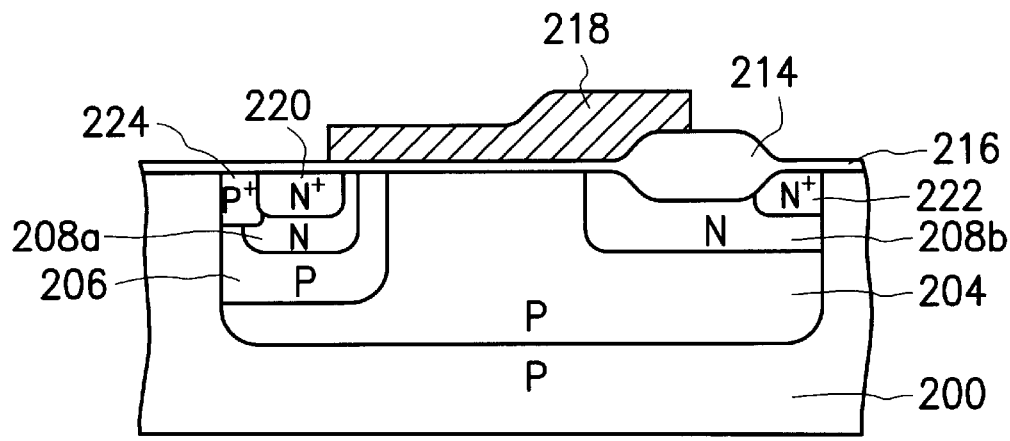

In FIG. 2H, a P$^+$-type doped region 224 is formed, for example, by implanting heavily P-type dopant into the second P-well 206. The P$^+$-type doped region 224 is between the source region 220 and the P-substrate 200 across a part of the first N-well 208a within the second P-well 206. The P$^+$-type doped region 224 has a dopant concentration higher than a dopant concentration of the second P-well 206.

It is to be noted that the types of the wells and doped regions are determined by the conductive type of the substrate and are not restricted as described in this embodiment. If the conductive type of the substrate is N-type, the types of the wells and of the doped regions have to be reversed.

SECOND EMBODIMENT

Figure 3:
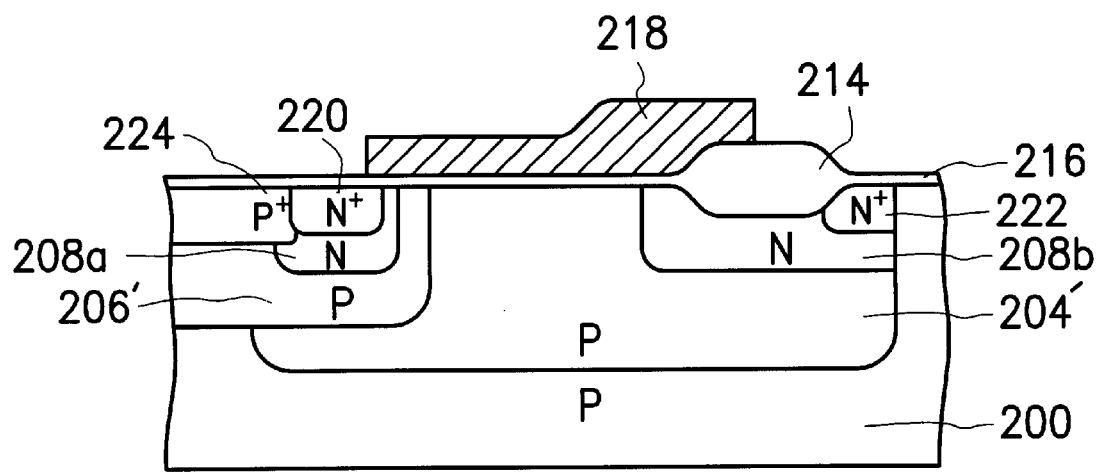
FIG. 3 is a cross-sectional view showing the structure of a high voltage device of a second embodiment.

The method for forming high voltage devices provided by this invention can form many kinds of high voltage devices. One structure of the high voltage devices is shown in FIG. 2H. In FIG. 3, another structure of the high voltage devices is shown. Since the process steps for forming the structure shown in FIG. 3 are as same as the steps described in first embodiment, it is not to be described again in this embodiment.

As shown in FIG. 3, a P-type substrate 200 is provided. A first P-well 204' and a second P-well 206' are formed in the P-type substrate 200. The first P-well 204' is next to the second P-well 206'. In this embodiment, the second P-well 206' is formed with a concentration higher than a concentration of the first P-well 204'. A first N-well 208a is formed in the second P-well 206' and a second N-well 208b is formed in the first P-well 204'. A field oxide layer 214 is formed on the second N-well and a gate oxide layer 216 is formed on the P-type substrate 200. The first N-well 208a comprises an N$^+$-type doped region 220 as a source region and the second N-well 208b comprises another N$^+$-type doped region 222 as a drain region. In the second P-well 206', there is a P$^+$-type doped region 224 formed between the source region 220 and the P-substrate 200 across a part of the first N-well 208a within the second P-well 206'. A gate 218 is on the gate oxide layer 216 across a portion of the field oxide layer 214 and a portion of the first N-well 208a.

In the invention, the first P-well with a heavier doped concentration than a doped concentration of the substrate is formed under the drain region. A dopant concentration of the N-wells as a drift region can be increased to enhance current driving performance from the higher doped concentration of the first p-well. Furthermore, the first N-well separates the source region from the substrate so that an electric field at the source/drain region-substrate junction formed in the prior art technique can be decreased and the breakdown voltage can be increased.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming high voltage devices, comprising the steps of:
   providing a P-type substrate;
   forming an oxide layer on the P-type substrate;
   forming a first P-well and a second P-well in the P-type substrate;
   forming a first N-well in the second P-well and a second N-well in the first P-well, respectively;
   removing the oxide layer;
   forming a field oxide layer on the second N-well and a gate oxide layer on the P-type substrate;
   forming a gate on the gate oxide layer across a portion of the first N-well and a portion of the field oxide layer on the second N-well;
   forming a source region in the first N-well and a drain region in the second N-well; and
   forming a P$^+$-type doped region between the source region and the P-type substrate across the first N-well within the second P-well.

2. The method according to claim 1, wherein the first P-well, the second P-well, the first N-well and the second N-well are respectively formed by an implantation and drive-in process.

3. The method according to claim 1, wherein a dopant concentration of the second P-well is higher than a dopant concentration of the first P-well.

4. A method for forming high voltage devices, comprising the steps of:
   providing a N-type substrate;
   forming an oxide layer on the N-type substrate;
   forming a first N-well and a second N-well in the N-type substrate;
   forming a first P-well in the second N-well and a second P-well in the first N-well, respectively;
   removing the oxide layer;
   forming a field oxide layer on the second N-well and a gate oxide layer on the N-type substrate;
   forming a gate on the gate oxide layer across a portion of the field oxide layer on the second P-well and a portion of the first P-well;
   forming a source region in the first P-well and a drain region in the second P-well; and
   forming a N$^+$-type doped region the source region and the N-type substrate across a part of the first P-well within the second N-well.

5. The method according to claim 4, wherein the first N-well, the second N-well, the first P-well and the second P-well are respectively formed by an implantation and drive-in process.

6. The method according to claim 4, wherein a dopant concentration of the second N-well is higher than a dopant concentration of the first N-well.

* * * * *